United States Patent
Tihanyi

(10) Patent No.: US 6,861,706 B2
(45) Date of Patent: Mar. 1, 2005

(54) COMPENSATION SEMICONDUCTOR COMPONENT

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/462,420

(22) Filed: Jun. 16, 2003

(65) Prior Publication Data

US 2003/0230767 A1 Dec. 18, 2003

(30) Foreign Application Priority Data

Jun. 14, 2002 (DE) .......................................... 102 26 664

(51) Int. Cl.⁷ .............................................. H01L 29/76
(52) U.S. Cl. ...................... 257/342; 257/135; 257/147; 257/328; 257/329; 257/355; 257/401
(58) Field of Search ................................ 257/328, 341, 257/342, 343, 329, 330, 331, 401, 133, 139, 147, 149, 155, 135, 355

(56) References Cited

U.S. PATENT DOCUMENTS

| | | | | |
|---|---|---|---|---|
| 5,323,059 A | * | 6/1994 | Rutter et al. ................ | 257/768 |
| 5,438,215 A | | 8/1995 | Tihanyi | |
| 5,510,634 A | * | 4/1996 | Okabe et al. ................ | 257/139 |
| 5,572,048 A | * | 11/1996 | Sugawara .................... | 257/132 |
| 6,037,632 A | * | 3/2000 | Omura et al. ................ | 257/341 |
| 6,184,555 B1 | | 2/2001 | Tihanyi et al. | |
| 6,274,904 B1 | * | 8/2001 | Tihanyi ....................... | 257/329 |
| 2001/0028083 A1 | | 10/2001 | Onishi et al. | |

FOREIGN PATENT DOCUMENTS

| | | |
|---|---|---|
| DE | 43 09 764 C2 | 9/1994 |
| DE | 101 00 802 C1 | 8/2002 |
| EP | 0 879 481 B1 | 11/1998 |

* cited by examiner

*Primary Examiner*—David Nelms
*Assistant Examiner*—Andy Huynh
(74) *Attorney, Agent, or Firm*—Laurence A. Greenberg; Werner H. Stemer; Gregory L. Mayback

(57) ABSTRACT

A compensation semiconductor component has a drift zone formed in a semiconductor body and at least one compensation zone formed in the edge region of the semiconductor body in the drift zone. The compensation zone is doped complementarily to the drift zone and connected by at least one connecting zone to a channel zone, which is doped complementarily to the drift zone and isolates the drift zone from a first terminal zone of the same conductivity type as the drift zone. A control electrode is formed in a manner insulated from the channel zone.

5 Claims, 2 Drawing Sheets

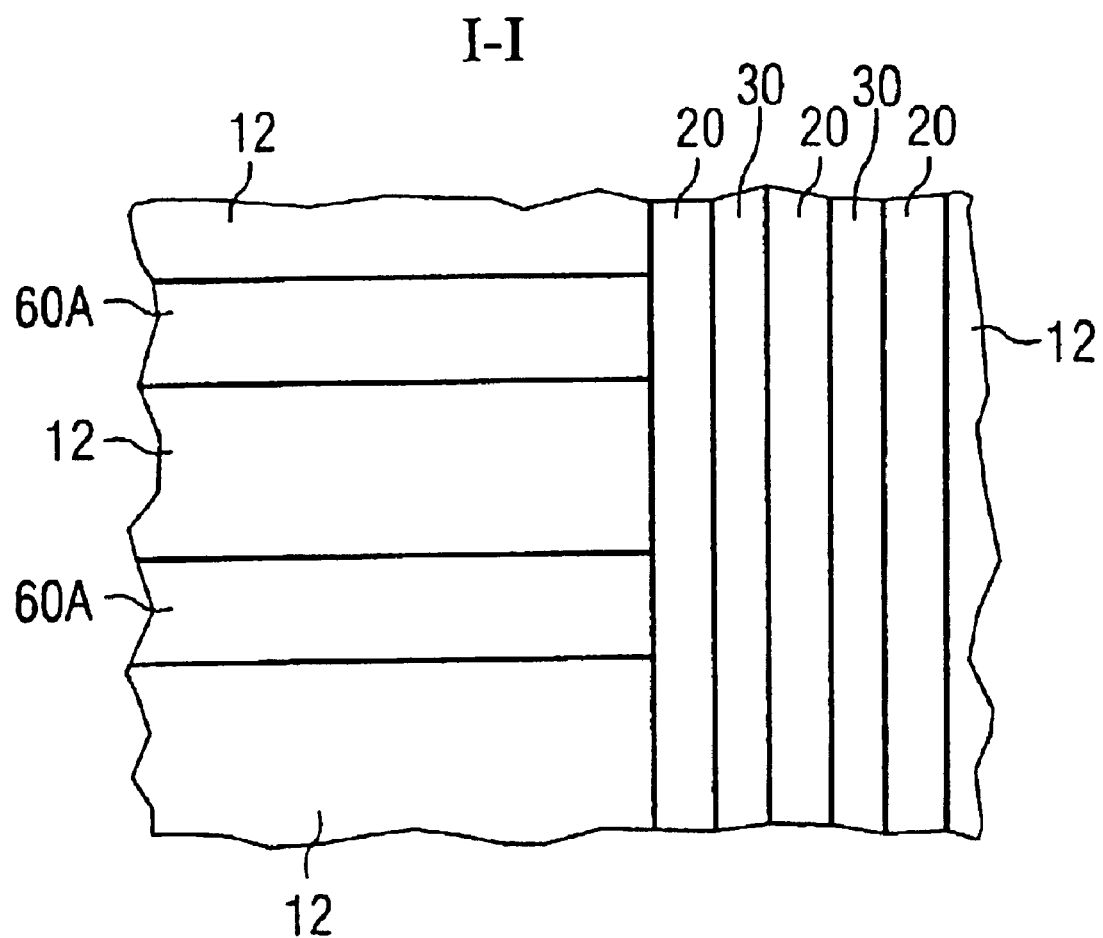

COMPENSATION SEMICONDUCTOR COMPONENT

BACKGROUND OF THE INVENTION

Field of the Invention

The present invention relates to a field-effect-controllable compensation semiconductor component.

Semiconductor components of this type are sufficiently known and described for example in German Patent DE 43 09 764 C2, corresponding to U.S. Pat. No. 5,438,215, or European Patent EP 0 879 481 B1, corresponding to U.S. Pat. No. 6,184,555. The essential aspect of compensation components of this type is that compensation zones are formed in a drift zone, which compensation zones are doped complementarily to the drift zone and are usually connected to the channel zone, referred to as a body zone in MOSFETs. The compensation zones enable a higher doping of the drift zone and thus bring about a reduced on resistance of the semiconductor component without reducing the dielectric strength of the component. This is because if the semiconductor component is driven in the off state and there is a reverse voltage across the semiconductor component, and thus across the drift zone, then the compensation zones ensure that the free charge carriers of the drift zone are depleted and the drift zone behaves like an undoped semiconductor material with regard to the dielectric strength.

In semiconductor components of this type, it is known for compensation zones likewise to be provided in edge regions of the semiconductor body, which compensation zones are disposed in a floating fashion, however, that is to say are not connected to a defined potential. If these compensation zones disposed in a floating fashion, with the semiconductor component in the off state, are intercepted once by the space charge zone propagating in the drift zone, then the compensation zones and the surrounding regions of the drift zone are depleted of free charge carriers. The floating configuration of the compensation zones has the effect that even when the component is switched on again, the edge regions remain depleted and thus do not contribute to the current carrying of the component.

SUMMARY OF THE INVENTION

It is accordingly an object of the invention to provide a compensation semiconductor component that overcomes the above-mentioned disadvantages of the prior art devices of this general type, which has a reduced on resistance.

With the foregoing and other objects in view there is provided, in accordance with the invention, a field-effect-controllable compensation semiconductor component. The semiconductor component contains a semiconductor body having a front side, a rear side, and an edge region, a drift zone disposed in the semiconductor body, a first terminal zone of a first conductivity type disposed in a region of the front side, a channel zone of a second conductivity type formed between the first terminal zone and the drift zone, and a control electrode disposed insulated from the semiconductor body and adjacent to the channel zone. At least one first compensation zone of the second conductivity type, is provided. The compensation zone is formed in the drift zone below the channel zone and adjoining the channel zone. At least one second compensation zone of the second conductivity type, is provided. The second compensation zone is formed in the edge region of the semiconductor body in the drift zone. At least one connecting zone of the second conductivity type is provided and connects the second compensation zone to the channel zone.

In MOS transistors, the second terminal zone forms the source zone of the transistors and the channel zone forms the body zone of the transistors. In MOS transistors, the body zone and the source zone are usually short-circuited, so that the body zone is at source potential.

When the transistor is in the off state, the compensation zones and the drift zones mutually deplete one another both below the body zone and in the edge regions of the semiconductor component and thus bring about a high dielectric strength of the semiconductor component. Upon reswitch-on, the charge carriers stored in the compensation zones in the edge regions can flow away via the connecting zone and the body zone to the source potential, so that the space charge zone previously built up in the edge regions diminishes and the edge regions can contribute to the current conducting of the semiconductor component, which results in an overall reduction of the on resistance of the semiconductor component.

The connecting zone, which connects the at least one compensation zone in the edge region to the body zone, is preferably doped more lightly than the compensation zone or dimensioned to be so small with regard to its spatial dimensioning that the connecting zone, with the semiconductor component in the off state, is already completely depleted of free charge carriers at low reverse voltages, in order thus to prevent an exchange of charge carriers between the compensation zones in the edge region and the body zone.

In one embodiment, it is provided that the connecting zone is formed along the front side of the semiconductor body and directly connects the compensation zone disposed in the edge region to the channel zone.

In a further embodiment, it is provided that the connecting zone connects the compensation zone disposed in the edge region to a compensation zone disposed below the channel zone or body zone, as a result of which the connecting zone connects the compensation zone disposed in the edge region to the body zone indirectly via the compensation zone disposed below the body zone.

Preferably, the number of dopant atoms present in total in the drift zone is at least approximately equal to the total number of dopant atoms present in the compensation zones, as a result of which the drift zone and the compensation zones can mutually deplete one another completely when a reverse voltage is applied.

Other features which are considered as characteristic for the invention are set forth in the appended claims.

Although the invention is illustrated and described herein as embodied in a compensation semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1B is a sectional view of the semiconductor component take along the sectional line IB—IB illustrated in FIG. 1A.

DESCRIPTION OF THE PREFERRED EMBODIMENTS

Figure 1A:
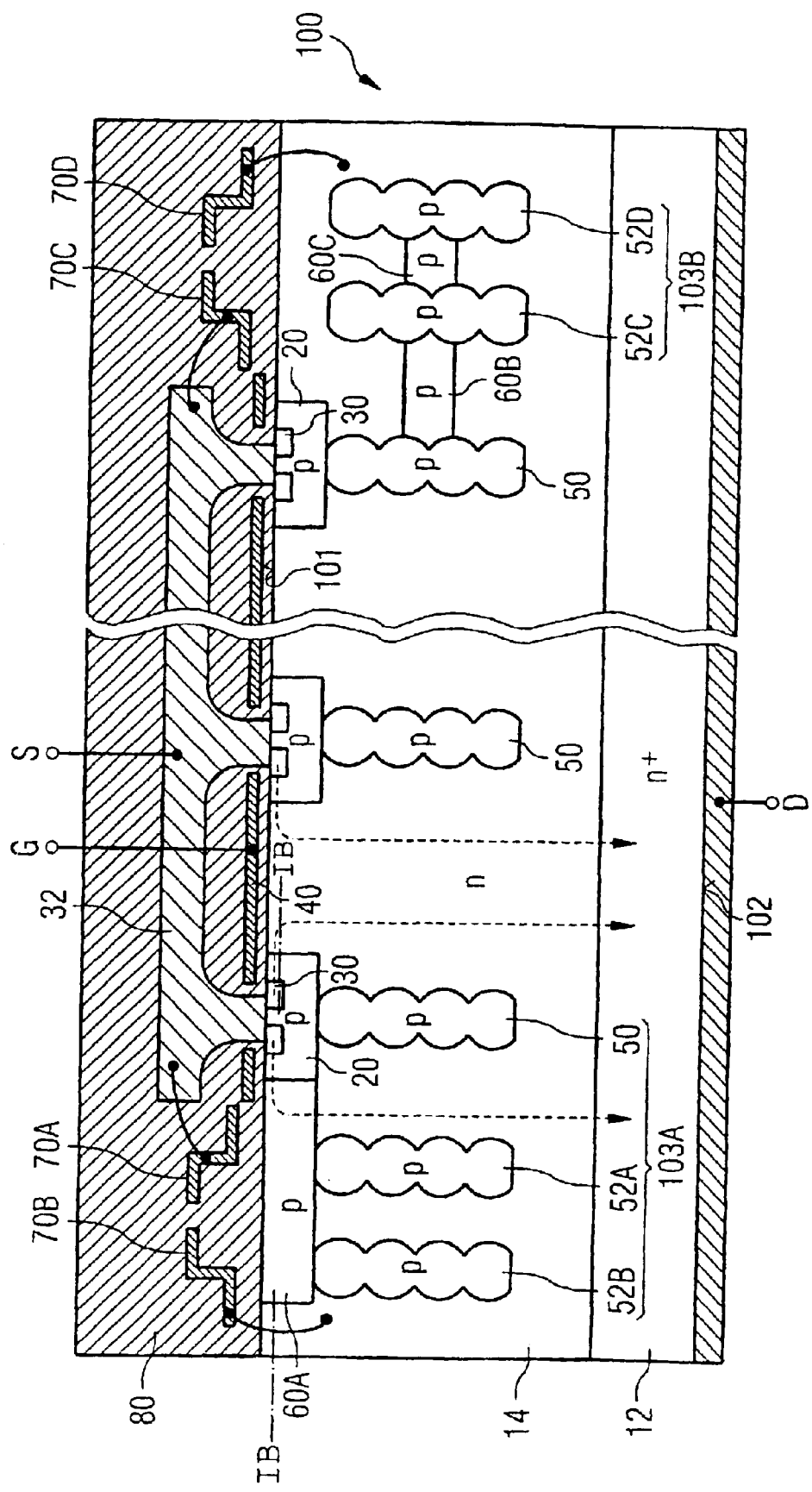
FIG. 1A is a diagrammatic, side-sectional view of a semiconductor component according to the invention.

Referring now to the figures of the drawing in detail and first, particularly, to FIG. 1A thereof, there is shown a semiconductor component that is an n-conducting MOS transistor. It goes without saying that the invention can also be applied to p-conducting MOS transistors, in which case it is necessary to provide complementary dopings with respect to the semiconductor component illustrated in FIG. 1A.

The semiconductor component contains a semiconductor body 100 with a drain zone 12 disposed in a region of a rear side 102 of the semiconductor body 100, which drain zone 12 is adjoined by an n-doped drift zone 14, which is doped more weakly than the drain zone 12. Heavily n-doped source zones 30 are formed in the region of a front side 101 of the semiconductor body 100, which source zones 30, in the exemplary embodiment, are surrounded in the semiconductor body 100 by a p-doped channel zone or body zone 20, so that the body zone 20 is disposed between the source zone 30 and the drift zone 14. In the exemplary embodiment, gate electrodes 40 are formed above the front side 101 in a manner insulated from the semiconductor body 100, which gate electrodes 40 extend in the lateral direction of the semiconductor body 100 from the source zone 30 along a section of the body zone 20 adjoining the front side 101 as far as a section of the drift zone 14 adjoining the front side 101. The source zones 30 are contact-connected by a source electrode 32, which simultaneously short-circuits the source zone 30 and the body zone 20. The source electrode 32 and the gate electrode 40 are insulated from one another by an insulation layer 80.

The semiconductor component is constructed in cellular fashion that is to say that a multiplicity of identical structures are present each having the body zone 20 and the source zone 30 disposed in the body zone 20 and the assigned gate electrode 40.

In the exemplary embodiment illustrated, a p-doped compensation zone 50 is in each case formed below each body zone 20, which compensation zones extend in the vertical direction of the semiconductor body 100 in a manner adjoining the body zones 20 in the direction of the drain zone 12.

The semiconductor body 100 has edge regions 103A, 103B, in which p-doped compensation zones 52A, 52B, 52C, 52D are likewise formed, which likewise run in the vertical direction of the semiconductor body 100.

According to the invention, connecting zones 60A, 60B, 60C are provided, which connect the compensation zones 52A–52D of the edge regions 103A, 103B to one of the body zones 20.

FIG. 1A shows two different configurations of such connecting zones, the connecting zones 60A in the edge region 103A illustrated on the left in the FIG. 1A being formed below the front side 101 of the semiconductor body and connecting the two compensation zones 52A, 52B illustrated to the body zone 20.

In the edge region 103B illustrated on the right in FIG. 1A, connecting zones 60B, 60C run at a distance from the front side 101 and connect the compensation zones 52C, 52D disposed in the edge region 103B to the compensation zone 50, which runs below the body zone 20 and is connected to the body zone 20. In this embodiment, the compensation zones 52C, 52D of the edge region 103B are connected to the body zone 20 indirectly via the connecting zones 60B, 60C and the compensation zone 50.

The semiconductor component illustrated turns on or off according to a drive potential applied to the gate electrode 40, the n-conducting semiconductor component illustrated turning on when a positive drive potential is applied to the gate electrode 40. When a voltage is applied between the drain zone 12, or a drain terminal D, and the source zone 30, or a source terminal S, the majority charge carriers, electrons in the present case, flow from the source zone 30 via a channel, formed in the channel zone 20 below the front side 101, and the drift zone 14 to the drain zone 12, as is depicted by broken lines in FIG. 1A. The compensation zones 50 connected to the body zone 20 are at source potential via the body zone and thus do not impede the charge carrier transport. The same applies to the compensation zones 52A–52D in the edge regions 103A, 103B, which are connected to the body zone 20 via the connecting zones 60A, 60B, 60C, so that a charge carrier transport also takes place in the edge regions 103A, 103B, which results in an overall reduction of the on resistance of the component.

The connecting zones 60A, 60B are preferably configured in strip form, as is shown by way of example in the sectional illustration of FIG. 1B, so that, in the left-hand edge region 103A, too, charge carriers can emerge from the body zone and move in the direction of the drain zone 12.

In the right-hand edge region 103B, the strip-type configuration of the connecting zones 60B, 60C enables the charge carriers emerging from the body zone 20 to move between the strip-type sections of the connecting zones 60B, 60C through to the drain zone 12.

If the MOS transistor turns off, a space charge zone forms proceeding from the body zones 20, which are at the source potential, and the compensation zones 50 connected to the body zone 20, which space charge zone has the effect that charge carriers of the compensation zones 50 and charge carriers of the surrounding regions of the drift zone 12 mutually compensate for one another. In this case, the extent to which the space charge zone propagates is dependent on the applied reverse voltage. At the maximum possible reverse voltage, before a voltage breakdown occurs, the space charge zone intercepts the entire drift zone 14. The drift zone 14 and the compensation zone 50, 52A–52D mutually deplete one another completely of charge carriers if the number of dopant atoms in the drift zone 14 corresponds to the number of dopant atoms present in the compensation zones 50 and 52A–52D.

The connecting zones 60A, 60B, 60C are doped or configured with regard to their geometrical dimensions such that they are already completely depleted of charge carriers at low reverse voltages, that is to say at much lower reverse voltages than the maximum reverse voltage and still before the compensation zones 52A–52D are completely depleted. As a result, an exchange of charge carriers between the compensation zones 52A–52D disposed in the edge region and the body zone is already prevented at low reverse voltages.

For the sake of completeness, it shall be mentioned that the edge regions 103A, 103B may, moreover, be formed as in conventional semiconductor components of this type. Thus, by way of example, it is possible to form field plates 70A–70D above the front side 101 of the semiconductor body, which are connected either to the drift zone 12 or to the source electrode 32.

I claim:

1. A field-effect-controllable compensation semiconductor component, comprising:

a semiconductor body having a front side, a rear side, and an edge region;

a drift zone disposed in said semiconductor body;

a first terminal zone of a first conductivity type disposed in a region of said front side;

a channel zone of a second conductivity type formed between said first terminal zone and said drift zone;

a control electrode disposed insulated from said semiconductor body and adjacent to said channel zone;

at least one first compensation zone of said second conductivity type, said first compensation zone formed in said drift zone below said channel zone and adjoining said channel zone;

at least one second compensation zone of said second conductivity type, said second compensation zone formed in said edge region of said semiconductor body in said drift zone; and at least one connecting zone of said second conductivity type, said connecting zone connecting said second compensation zone to said channel zone.

2. The semiconductor component according to claim 1, wherein said connecting zone is doped more weakly than said second compensation zone.

3. The semiconductor component according to claim 1, wherein said connecting zone is formed along said front side of said semiconductor body and directly connects said second compensation zone disposed in said edge region to said channel zone.

4. The semiconductor component according to claim 1, wherein said connecting zone connects together said second compensation zone disposed in said edge region and said first compensation zone disposed below said channel zone.

5. The semiconductor component according to claim 1, wherein a number of dopant atoms of said first conductivity type in said drift zone approximately corresponds to a number of dopant atoms in said first and second compensation zones.

* * * * *